(12) United States Patent
Sura et al.

(10) Patent No.: US 7,272,009 B2
(45) Date of Patent: Sep. 18, 2007

(54) METHOD AND APPARATUS FOR HEAT SINK AND CARD RETENTION

(75) Inventors: Lisa Sura, Pflugerville, TX (US);
Darren B. Pav, Round Rock, TX (US);
Richard Worley, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 77 days.

(21) Appl. No.: 11/143,164

(22) Filed: Jun. 2, 2005

(65) Prior Publication Data

US 2006/0274507 A1 Dec. 7, 2006

(51) Int. Cl.
*H05K 7/20* (2006.01)

(52) U.S. Cl. .................. 361/719; 361/715; 361/785; 165/80.3; 439/159; 439/362

(58) Field of Classification Search ............. 361/686, 361/687, 701–710, 690–692, 714–719, 722, 361/725, 728, 731–734, 752–754, 796–802, 361/814–818; 174/16.1, 16.3, 52.1, 57; 165/80.2, 165/80.3, 185, 104.33, 165; 257/706–712, 257/718–727; 248/316.7, 505–510; 24/295, 24/297, 453, 457, 458, 627
See application file for complete search history.

(56) References Cited

U.S. PATENT DOCUMENTS 5,784,263 A * 7/1998 Nelson ................. 361/785
5,886,872 A * 3/1999 Koenen et al. ............. 361/719
5,910,884 A  6/1999 Garza et al.
6,173,843 B1 1/2001 Christiansen et al.
6,256,191 B1 7/2001 Curlee
6,269,863 B1 * 8/2001 Wyler .................. 165/80.3
6,278,614 B1 8/2001 Beamen et al.
6,366,456 B1 4/2002 Wu et al.
6,551,120 B2 4/2003 Daskalakis et al.
6,717,806 B2 * 4/2004 Nguyen et al. ............. 361/687
6,769,927 B2 8/2004 Brewer
6,771,510 B1 8/2004 Novak et al.
7,056,144 B2 * 6/2006 Barsun et al. ............. 439/362
7,090,519 B2 * 8/2006 Muramatsu et al. ........ 439/159
7,133,285 B2 * 11/2006 Nishimura ................. 361/715

* cited by examiner

*Primary Examiner*—Michael Datskovskiy
(74) *Attorney, Agent, or Firm*—Haynes and Boone, LLP (57) ABSTRACT

A heat sink retention apparatus includes a base member and a heat sink mount including a pivotal base coupler and a board mounting member, whereby the heat sink mount is operable to mount to a board by engaging the pivotal base coupler with the base member and engaging the board mounting member with the board. A cable routing member and a connector storage member may be included on the heat sink mount for the routing of cables and the storing of connectors. A card retention device may be provided which is operable to couple to the heat sink mount and engage a card to retain the card on the board.

23 Claims, 14 Drawing Sheets

METHOD AND APPARATUS FOR HEAT SINK AND CARD RETENTION

BACKGROUND

The present disclosure relates generally to information handling systems, and more particularly to heat sink and card retention in an information handling system.

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

The latest generation information handling systems have growing challenges related to the structural requirements driven by the increased retention forces required by heat sinks and expansion cards such as, for example, graphics cards. New technology has increased the power of expansion cards, resulting in increases in their weight and requiring higher retention forces in order to prevent their disengagement during shock and vibration events. In addition, information handling system standards such as, for example, the Intel BTX board standard, dictate the positioning of the processor and the expansion card, which can increase the difficulty of providing the needed retention forces. For example, the BTX board standard requires that the expansion card be centrally located in the chassis, near the processor, and away from the walls of the information handling system chassis which otherwise could be used to provide retention.

Furthermore, connectors and cables in these information handling systems raise a number of issues. Conventionally, the cables and connectors in the information handling system are allowed to run randomly throughout the information handling system chassis in different orientations depending on their state of use. This can result in inconsistent electromagnetic interference results, as the cables and connectors can become positioned over information handling system components, which can increase development and test costs. The cables and connectors are also more prone to chafing due to, for example, rubbing against sheet metal, which can cause failures. The random positioning of the cables and connectors can lead to additions customer service calls, as the location of the cables and connectors is random, making the cables and connectors harder to find. Finally, unused power cables may need to be capped or covered for safety reasons, increasing costs.

Accordingly, it would be desirable to provide for heat sink and card retention absent the disadvantages found in the prior methods discussed above.

SUMMARY

According to one embodiment, a heat sink retention apparatus is provided which includes a heat sink mount and a card retention device which is operable to couple to the heat sink mount.

A principal advantage of this embodiment is that a heat sink may be mounted in an information handling system chassis and a card may be retained in the information handling system chassis using the card retention device.

BRIEF DESCRIPTION OF THE DRAWINGS

FIG. 3b is a perspective view illustrating an embodiment of a second side of the heat sink mount of FIG. 3a.

FIG. 4 is a perspective view illustrating an embodiment of a card retention device used with the heat sink mount of FIG. 3a.

FIG. 5 is a perspective view illustrating an embodiment of a heat sink used with the heat sink mount of FIG. 3a.

FIG. 8b is a perspective view illustrating an embodiment of the base member of FIG. 2 mounted to the board of FIG. 7 during the method of FIG. 8a.

FIG. 8c is a front perspective view illustrating an embodiment of the heat sink of FIG. 5 mounted to the heat sink mount of FIG. 3a during the method of FIG. 8a.

FIG. 8d is a bottom perspective view illustrating an embodiment of the heat sink of FIG. 5 mounted to the heat sink mount of FIG. 3a during the method of FIG. 8a.

FIG. 8e is a perspective view illustrating an embodiment of the heat sink and heat sink mount of FIG. 8c mounted to the board and base member of FIG. 8b during the method of FIG. 8a.

FIG. 8f is a perspective view illustrating an embodiment of the card of FIG. 6 mounted to the board of FIG. 8e during the method of FIG. 8a.

FIG. 8g is a perspective view illustrating an embodiment of the card retention device of FIG. 4 coupled to the heat sink mount of FIG. 8f and retaining the card of FIG. 8f during the method of FIG. 8a.

FIG. 8h is a perspective view illustrating an embodiment of a plurality of cables routed on the heat sink mount of FIG. 8g during the method of FIG. 8a.

FIG. 8i is a perspective view illustrating an embodiment of a plurality of connectors stored on the heat sink mount of FIG. 8g during the method of FIG. 8a.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

Figure 1:
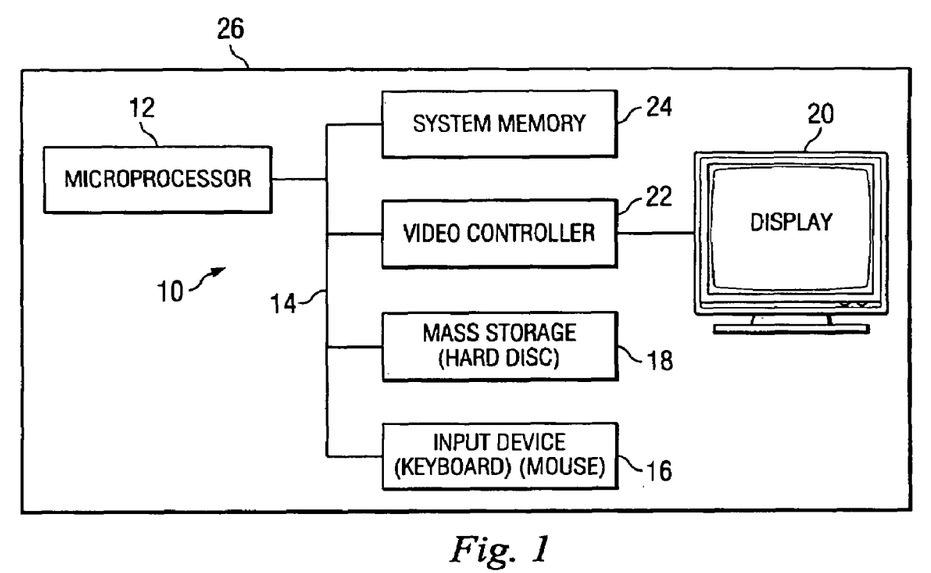
FIG. 1 is a schematic view illustrating an embodiment of an information handling system.

In one embodiment, information handling system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. In an embodiment, a chassis 26 houses some or all of the components of information handling system 10. It should be understood that other busses and intermediate circuits can be deployed between the components described above and microprocessor 12 to facilitate interconnection between the components and the microprocessor.

Figure 2:
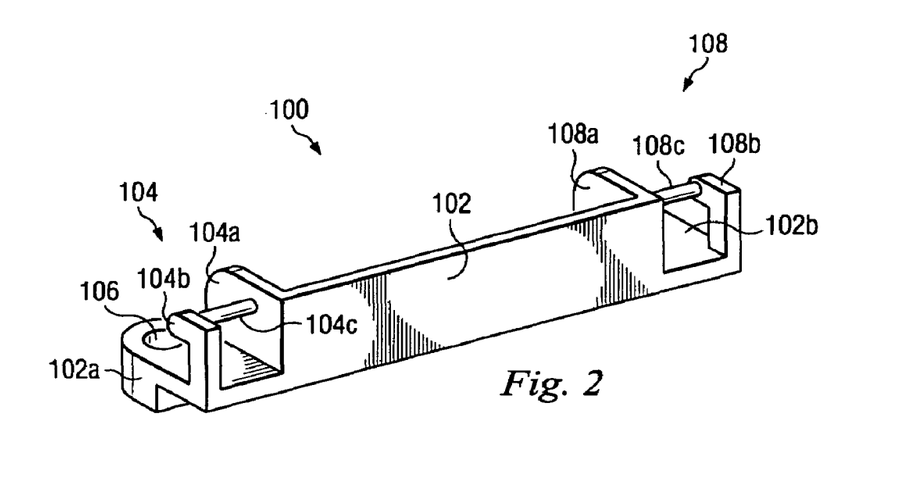
FIG. 2 is a perspective view illustrating an embodiment of a base member.

Referring now to FIG. 2, a base member 100 is illustrated. The base member 100 includes an elongated member 102 having a pair of opposing distal ends 102a and 102b. A pivotal coupling member 104 is located adjacent the end 102a and includes a support wall 104a which is substantially parallel to and spaced apart from a support arm 104b that extends from the elongated member 102. A pivoting beam 104c extends between the support wall 104a and the support arm 104b. A mounting aperture 106 is defined by the elongated member 102 and located adjacent the end 102a and the pivotal coupling member 104. A pivotal coupling member 108 is located adjacent the end 102b and includes a support wall 108a which is substantially parallel to and spaced apart from a support arm 108b that extends from the elongated member 102. A pivoting beam 108c extends between the support wall 108a and the support arm 108b. A mounting aperture (not shown), which is substantially similar to the mounting aperture 106, is defined by the elongated member 102 and located adjacent the end 102b and the pivotal coupling member 108.

Figure 3A:
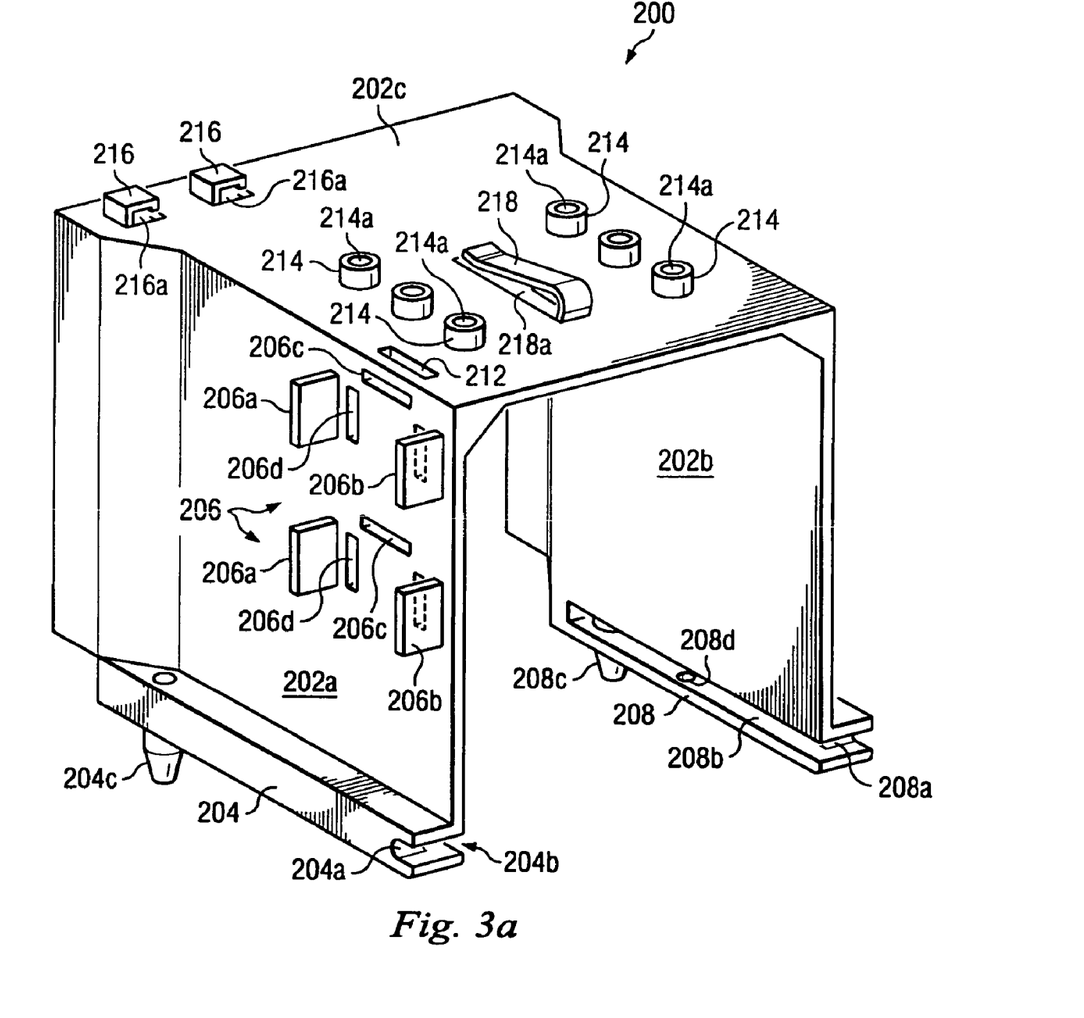
FIG. 3a is a perspective view illustrating an embodiment of a first side of a heat sink mount used with the base member of FIG. 2.
Figure 3B:
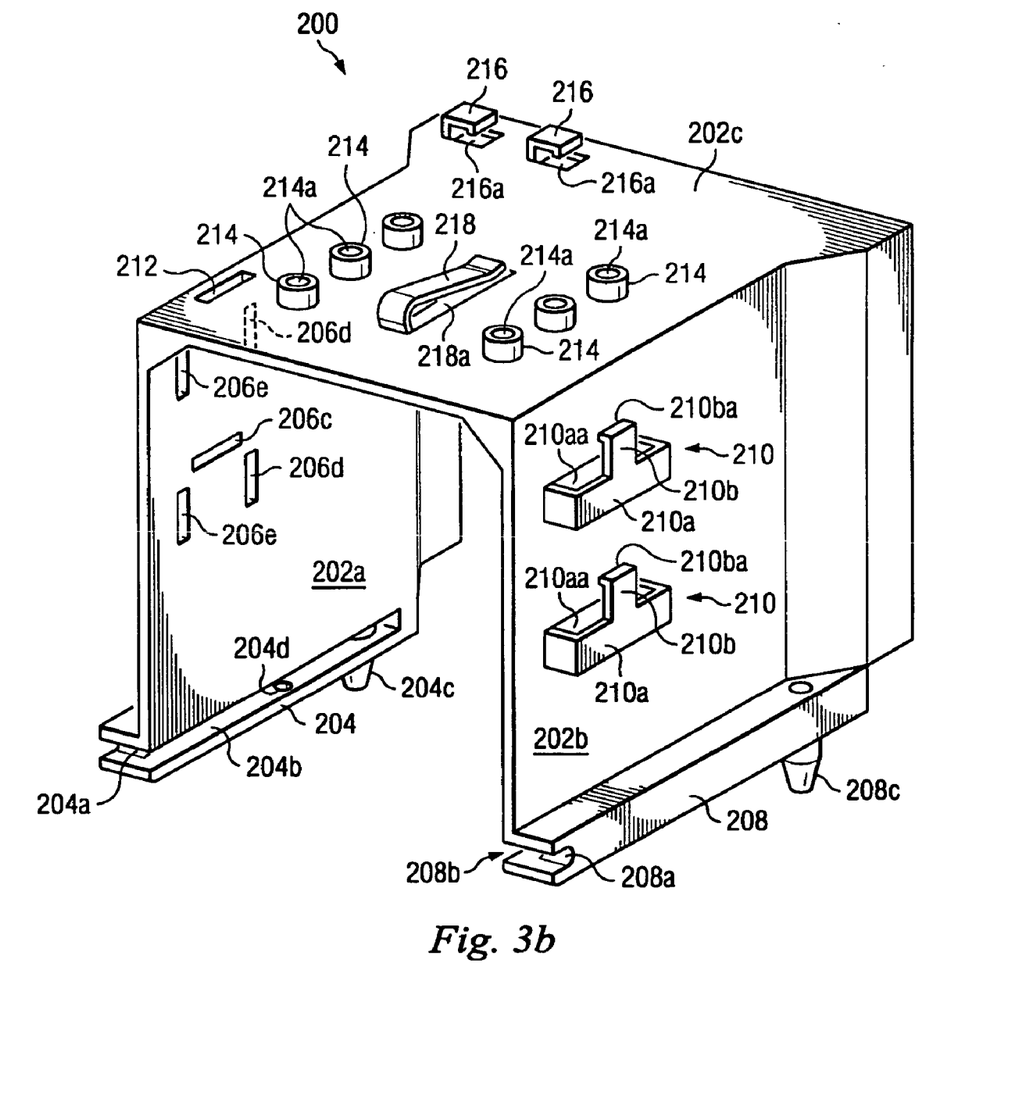

Referring now to FIGS. 3a and 3b, a heat sink mount 200 is illustrated. A heat sink mount 200 includes a pair of substantially parallel side walls 202a and 202b which are spaced apart and coupled together by a top wall 202c.

A mounting member 204 extends from a distal end of the side wall 202a which is located opposite the top wall 202c. The mounting member 204 includes a substantially arcuate pivotal base coupler 204a which is located on a distal end of the mounting member 204. A heat sink coupling channel 204b is defined by the mounting member 204 and extends along the length of the mounting member 204. A base mount member 204c is located on a distal end of the mounting member 204 opposite the pivotal base coupler 204a and extends through the heat sink coupling channel 204b and from an edge of the mounting member 204. In an embodiment, the base mount member 204c includes a spring mounted threaded fastener. A heat sink mounting aperture 204d is defined by the mounting member 204 and located in the heat sink coupling channel 204b adjacent the base mount member 204c. A plurality of card retention device coupling members 206 are located on the side wall 202a adjacent each other and the top wall 202c. Each card retention device coupling member 206 includes a pair of substantially parallel and spaced apart support walls 206a and 206b extending from the side wall 202a, a guide aperture 206c defined by the side wall 202a and oriented substantially perpendicular to the support walls 206a and 206b, and a pair of coupling apertures 206d and 206e defined by the first wall and oriented substantially parallel to the support walls 206a and 206b.

A mounting member 208 extends from a distal end of the wall 202b which is located opposite the top wall 202c. The mounting member 208 includes a substantially arcuate pivotal base coupler 208a which is located on a distal end of the mounting member 208. A heat sink coupling channel 208b is defined by the mounting member 208 and extends along the length of the mounting member 208. A base mount member 208c is located on a distal end of the mounting member 208 opposite the pivotal base coupler 208a and extends through the heat sink coupling channel 208b and from an edge of the mounting member 208. In an embodiment, the base mount member 208c includes a spring mounted threaded fastener. A heat sink mounting aperture 208d is defined by the mounting member 208 and located in the heat sink coupling channel 208b adjacent the base mount member 208c. A plurality of connector storage members 210 are located on the side wall 202b adjacent each other and the top wall 202c. Each connector storage member 210 includes storage base 210a which extends from the side wall 202b and defines a storage slot 21Oaa between the storage base 210a and the side wall 202b. A securing arm 210b extend from the storage base 210a and substantially parallel to the side wall 202b and includes a securing lip 210ba on its distal end.

A guide aperture 212 is defined by the top wall 202a and positioned adjacent the side wall 202a and the card retention device coupling member 206 which is adjacent the top wall 202a. A plurality of heat pipes 214 extend from the top wall 202c in a spaced apart relationship with each heat pipe 214 defining a heat aperture 214a in the top wall 202c. A plurality of small cable routing members 216 extend from the top wall 202c and define a cable routing channel 216a along their length. A large cable routing member 218 extends from the top wall 202c, is substantially centrally located on the top wall 202c, and defines a cable routing channel 218a along its length.

Figure 4:
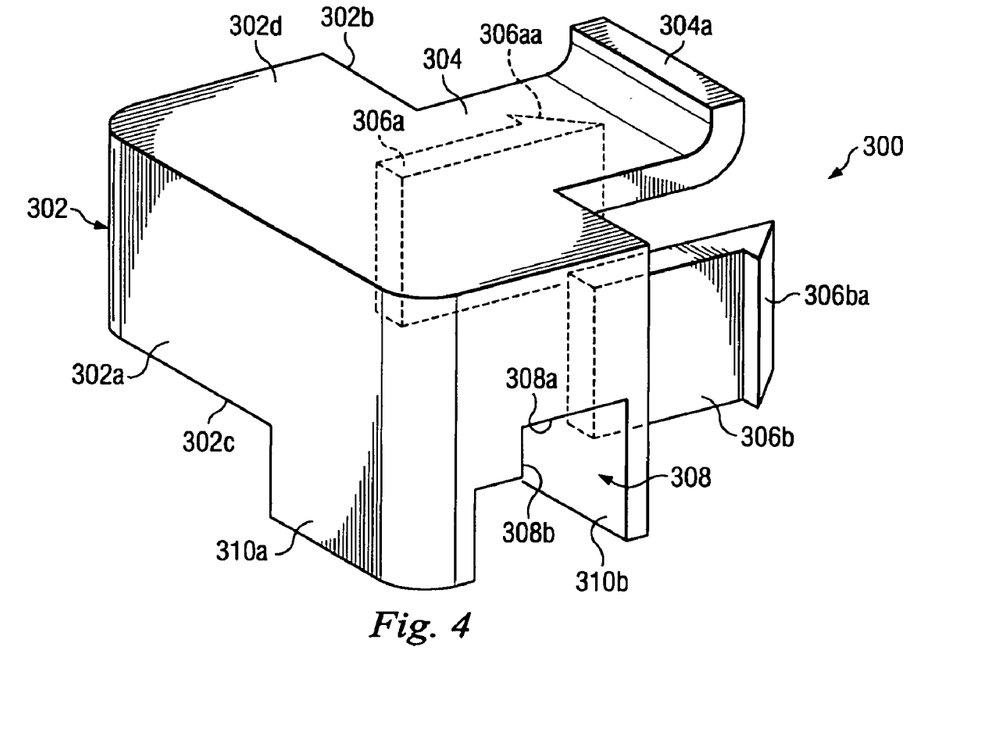

Referring now to FIG. 4, a card retention device 300 is illustrated. The card retention device 300 includes a base 302 having a pair of opposing side surfaces 302a and 302b, a bottom surface 302c extending between the side surfaces 302a and 302b, and a top surface 302d located opposite the bottom surface 302c. A guide arm 304 extends from the top surface 302d and the side surface 302b and includes an arcuate distal guide end 304a. A plurality of coupling arms 306a and 306b extend from the side surface 302b on opposite sides of the guide arm 304 with each including a securing member 306aa and 306ba on their distal ends. A card retention channel 308 is defined by the base 302 and includes a plurality of card retention surfaces 308a and 308b. A plurality of substantially parallel and spaced apart retention arms 310a and 310b extend from the bottom surface 302c on opposite sides of the retention channel 308.

Figure 5:
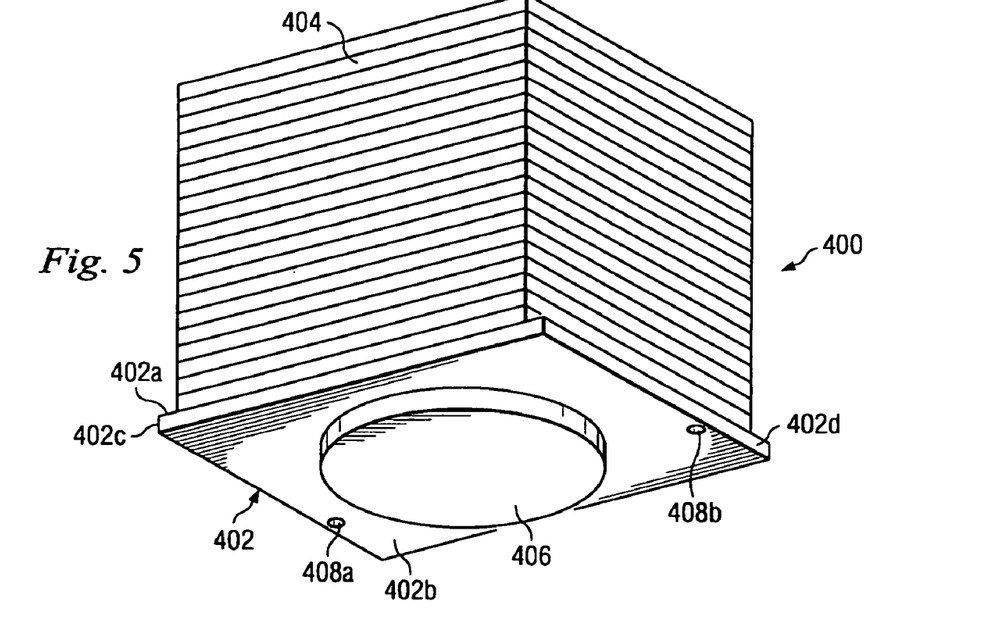

Referring now to FIG. 5, a heat sink 400 is illustrated. Heat sink 400 includes a base member 402 having a top surface 402a, a bottom surface 402b located opposite the top surface 402a, and a pair of guides 402c and 402d extending from opposite sides of the base member 402 and along the length of the base member 402. A finned heat dissipation structure 404 extends from the top surface 402a of the base member 402. A circular heat transfer die 406 extends from the bottom surface 402b of the base member 402. A plurality of mounting apertures 408a and 408b are defined by the guides 402c and 402d. In an embodiment, the heat sink 400 may be a conventional heat sink known in the art.

Figure 6:
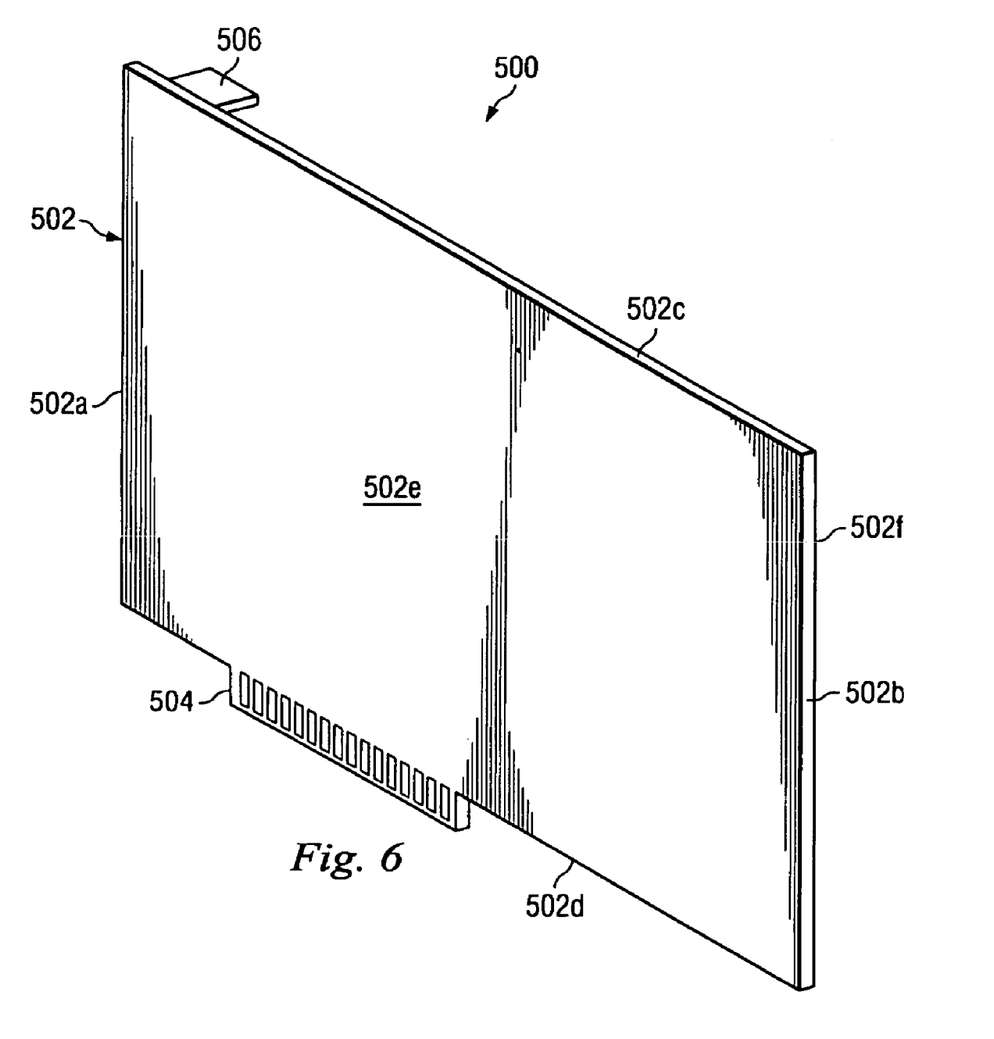
FIG. 6 is a perspective view illustrating an embodiment of a card used with the heat sink mount of FIG. 3a and the card retention device of FIG. 4.

Referring now to FIG. 6, a card 500 is illustrated. Card 500 includes a base 502 having a front surface 502a, a rear surface 502b located opposite the front surface 502a, a top surface 502c extending between the front surface 502a and the rear surface 502, a bottom surface 502d located opposite the top surface 502c, and a pair of opposing side surfaces 502e and 502f extending between the front surface 502a, the rear surface 502b, the top surface 502c, and the bottom surface 502d. A board coupling plug 504 extends from the bottom surface 502d and is located adjacent the front surface 502a of the base 502. In an embodiment, a stabilizing tab 506 extends from the side surface 502f and is located adjacent the top surface 502c and the front surface 502a. In an embodiment, the card 500 is a conventional card known in the art.

Figure 7:
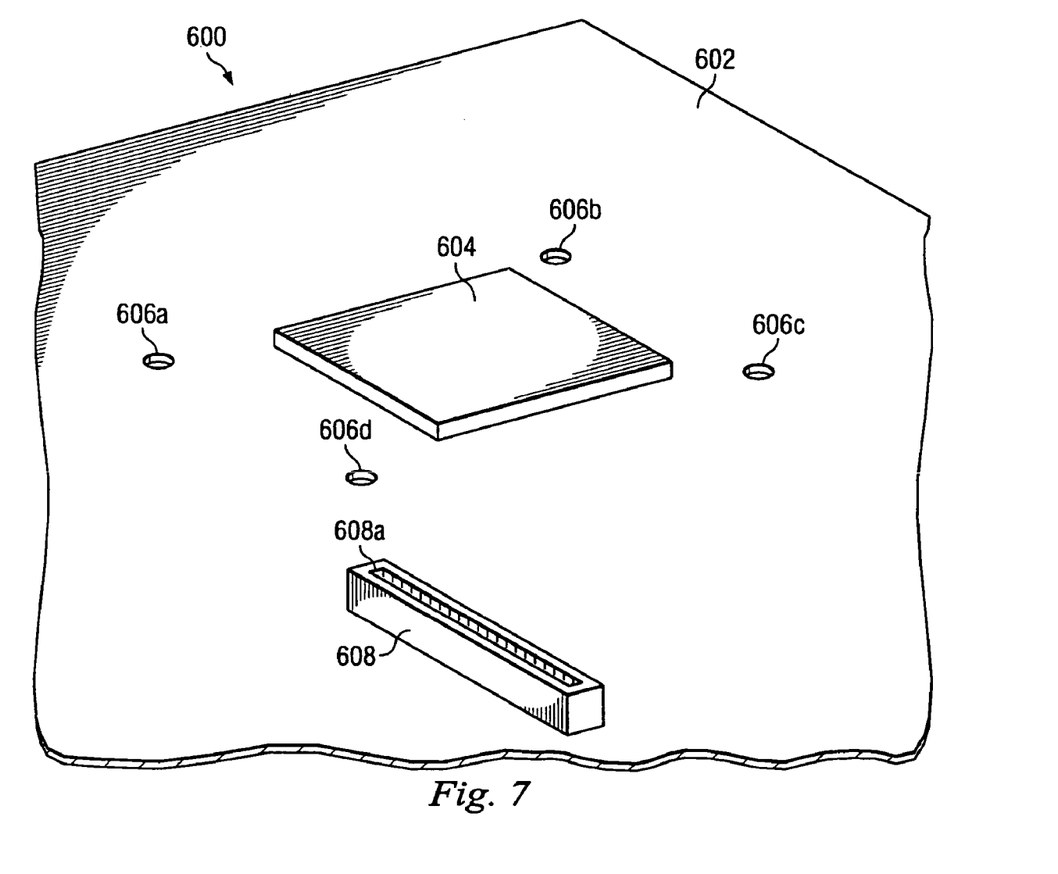
FIG. 7 is a perspective view illustrating an embodiment of a board used with the base member 2, the heat sink mount of FIG. 3a, the card retention device of FIG. 4, the heat sink of FIG. 5, and the card of FIG. 6.

Referring now to FIG. 7, a board 600 is illustrated. The board 600 may be mounted in an information handling system chassis such as, for example, the chassis 26 described above with reference to FIG. 1. The board 600 includes a top surface 602. A heat producing component 604 which may be, for example, the microprocessor 12 described above with reference to FIG. 1, is mounted to the top surface 602 of the board 600. A plurality of mounting apertures 606a, 606b, 606c, and 606d are defined by the board 600 and the top surface 602 and located in a spaced apart relationship on opposite sides of the heat producing component 604. A card coupling member 608 is mounted to the top surface 602 of the board 600 and located adjacent the heat producing component 604. The card coupling member 608 defines a card slot 608a along its length. In an embodiment, the board 600 is substantially similar in design and operation to the BTX board standard designed by Intel Corporation and known in the art.

Figure 8A:
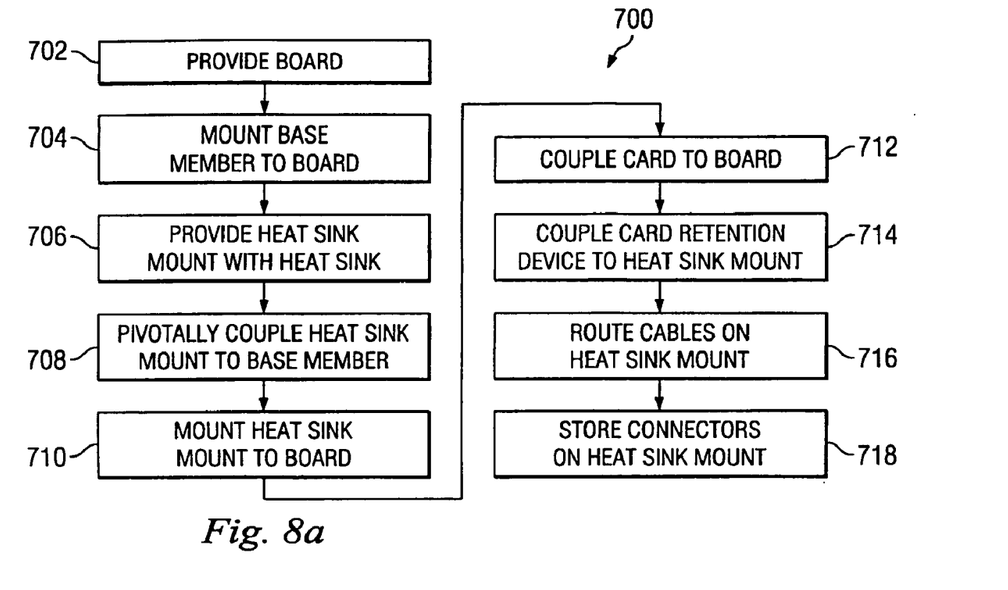
FIG. 8a is a flow chart illustrating an embodiment of a method for heat sink and card retention.
Figure 8B:
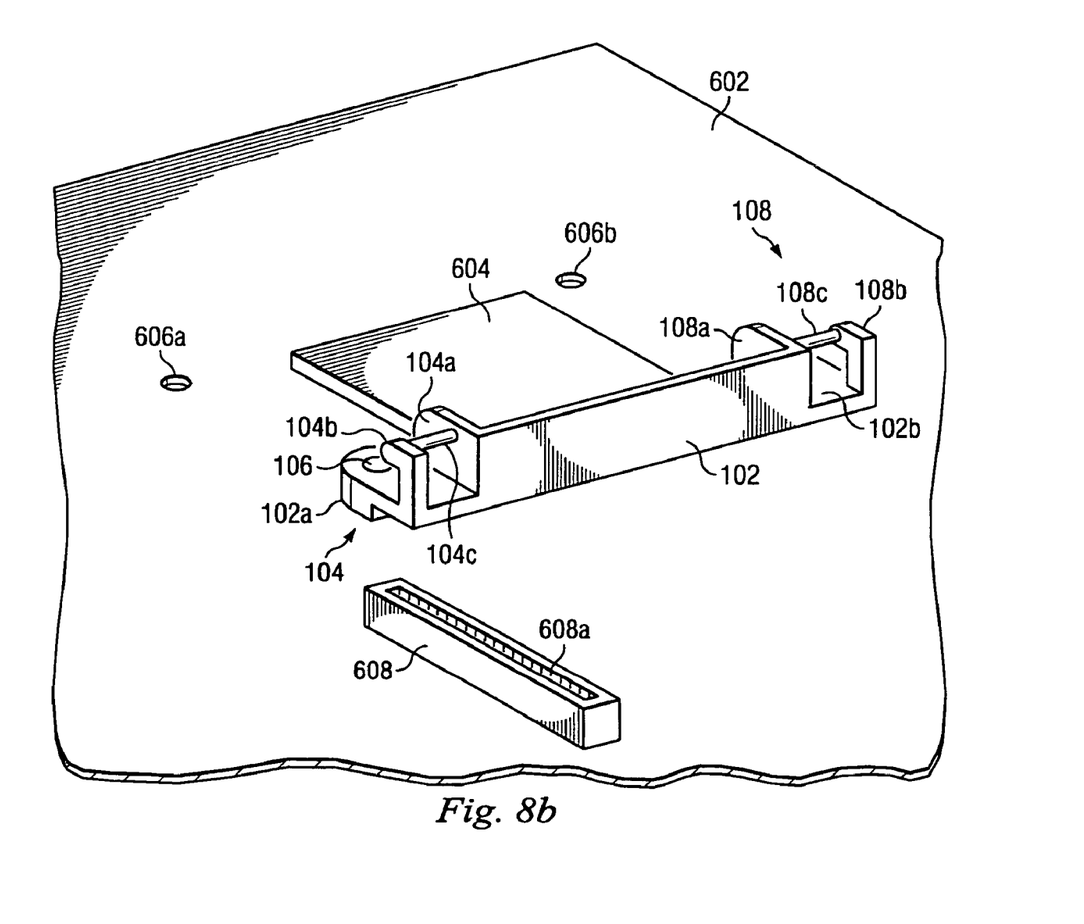

Referring now to FIGS. 2, 7, 8a, and 8b, a method 700 for heat sink and card retention begins at step 702 where the board 600 is provided. The method 600 then proceeds to step 704 where the base member 100 is mounted to the board 600. The base member 100 is positioned on the top surface 602 of the board 600 and adjacent the heat producing component 604 such that the mounting aperture 106 adjacent the end 102a of base member 100 is aligned with the mounting aperture 606d defined by the board 600 and the mounting aperture (not shown) adjacent the end 102b of base member 100 is aligned with the mounting aperture 602c defined by the board 600, as illustrated in FIG. 8b. The base member 100 may then be mounted to the top surface 602 of the board 600 using a variety of methods known in the art such as, for example, with the use of threaded fasteners, adhesives, and/or rivets.

Figure 8C:
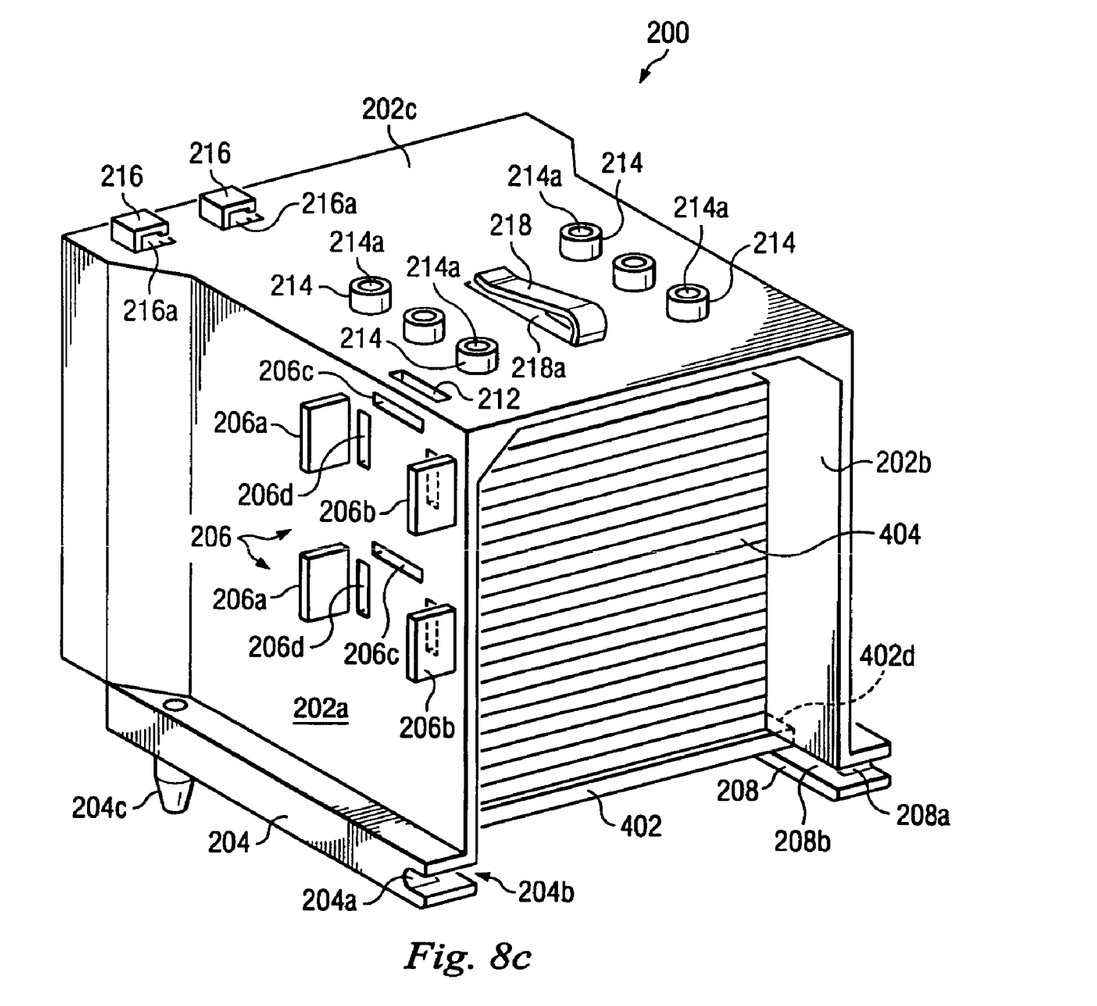
Figure 8D:
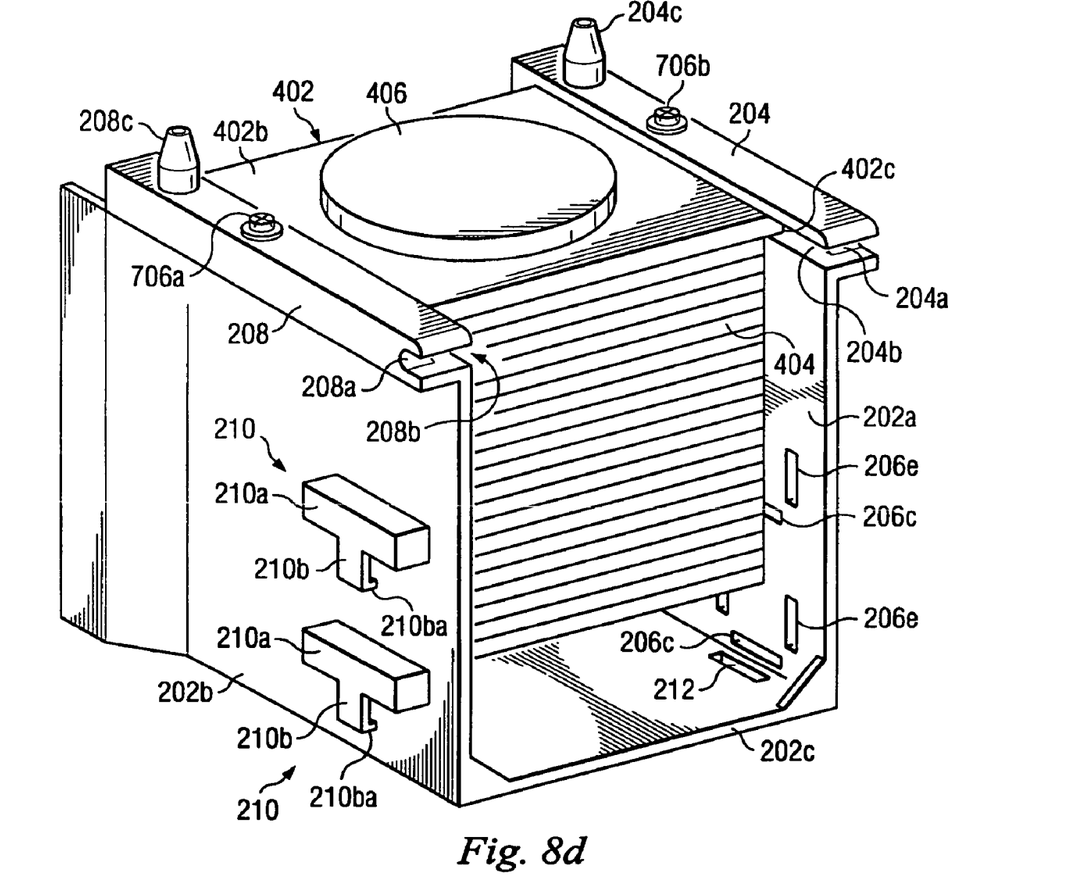

Referring now to FIGS. 3a, 3b, 5, 8a, 8c, and 8d, the method 700 then proceeds to step 706 where the heat sink mount 200 with the heat sink 400 is provided. The heat sink 400 is coupled to the heat sink mount 200 by positioning the heat sink 400 adjacent the heat sink mount 200 such that the guide 402c is adjacent the mounting member 204 and the guide 402d is adjacent the mounting member 208. The heat sink 400 may then be positioned between the side walls 202a and 202b by sliding the guides 402c and 402d into the heat sink coupling channels 204b and 208b, respectively. When the guides 402c and 402d are slid fully into the heat sink coupling channels 204b and 208b, as illustrated in FIG. 8c, the mounting apertures 408a and 408b on the heat sink 400 line up with the heat sink mounting apertures 204d and 208d, respectively. The heat sink 400 may then be mounted to the heat sink mount 200 by using methods known in the art such as, for example, using a pair of threaded fasteners 706a and 706b in the heat sink mounting apertures 204d and 208d, respectively, and the mounting apertures 408a and 408b, respectively, as illustrated in FIG. 8d. The heat sink mount 200 provides a means for handling the heat sink 400 without contacting the heat dissipation structure 404, which may include sharp edges.

Figure 8E:
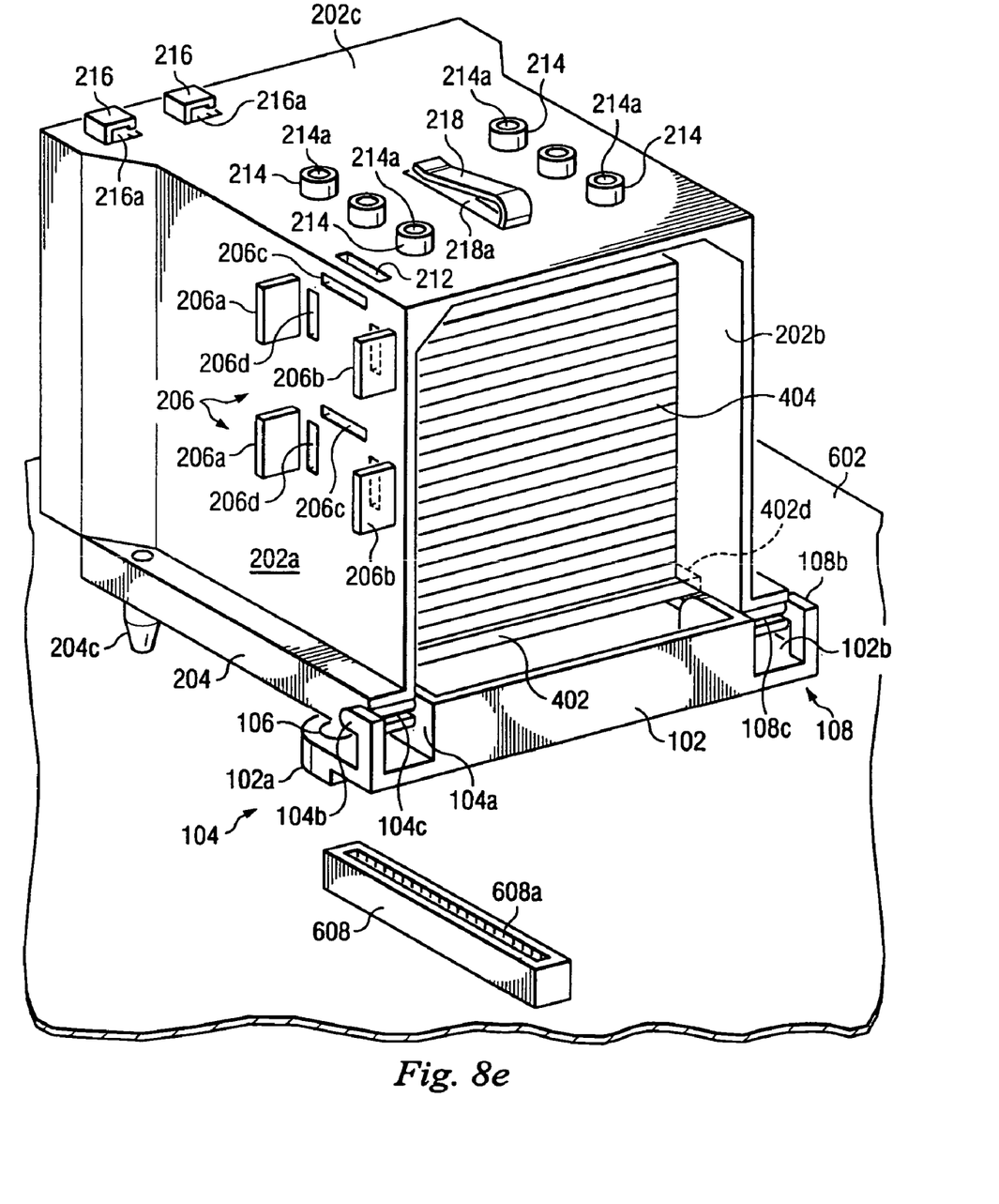

Referring now to FIGS. 3a, 3b, 5, 8a, 8b, 8d, and 8e, the method 700 proceeds to step 708 where the heat sink mount 200 is pivotally coupled to the board 600. The heat sink mount 200 is positioned adjacent the base member 100 on the top surface 602 of the board 600 such that the mounting members 204 and 208 are oriented at an angle relative to the top surface 602 of the board 600 and the pivotal base couplers 204a and 208a are adjacent the ends 102a and 102b, respectively, of the base member 100. The pivotal base couplers 204a and 208a are then engaged with the pivoting beams 104c and 108c, respectively, on the base member 100. The method 600 then proceeds to step 710 where the heat sink mount 200 is mounted to the board 600. The heat sink mount 200 is pivoted about the pivoting beams 104c and 108c and towards the top surface 602 of the board 600 such that the mounting members 204 and 208 are oriented parallel with the top surface 602 of the board 600. With the mounting members 204 and 208 oriented parallel with the top surface 602 of the board 600, as illustrated in FIG. 8e, the base mount members 204c and 208c substantially align with the mounting apertures 606a and 606b, respectively, defined by the board 600, and the heat transfer die 406 engages the heat producing component 604 mounted to the top surface 602 of the board 600. The heat sink mount 200 may then be mounted to the board 600 using methods known in the art such as, for example, engaging spring mounted threaded fasteners which are provided in the base mount members 204c and 208c with the mounting apertures 606a and 606b.

Figure 8F:
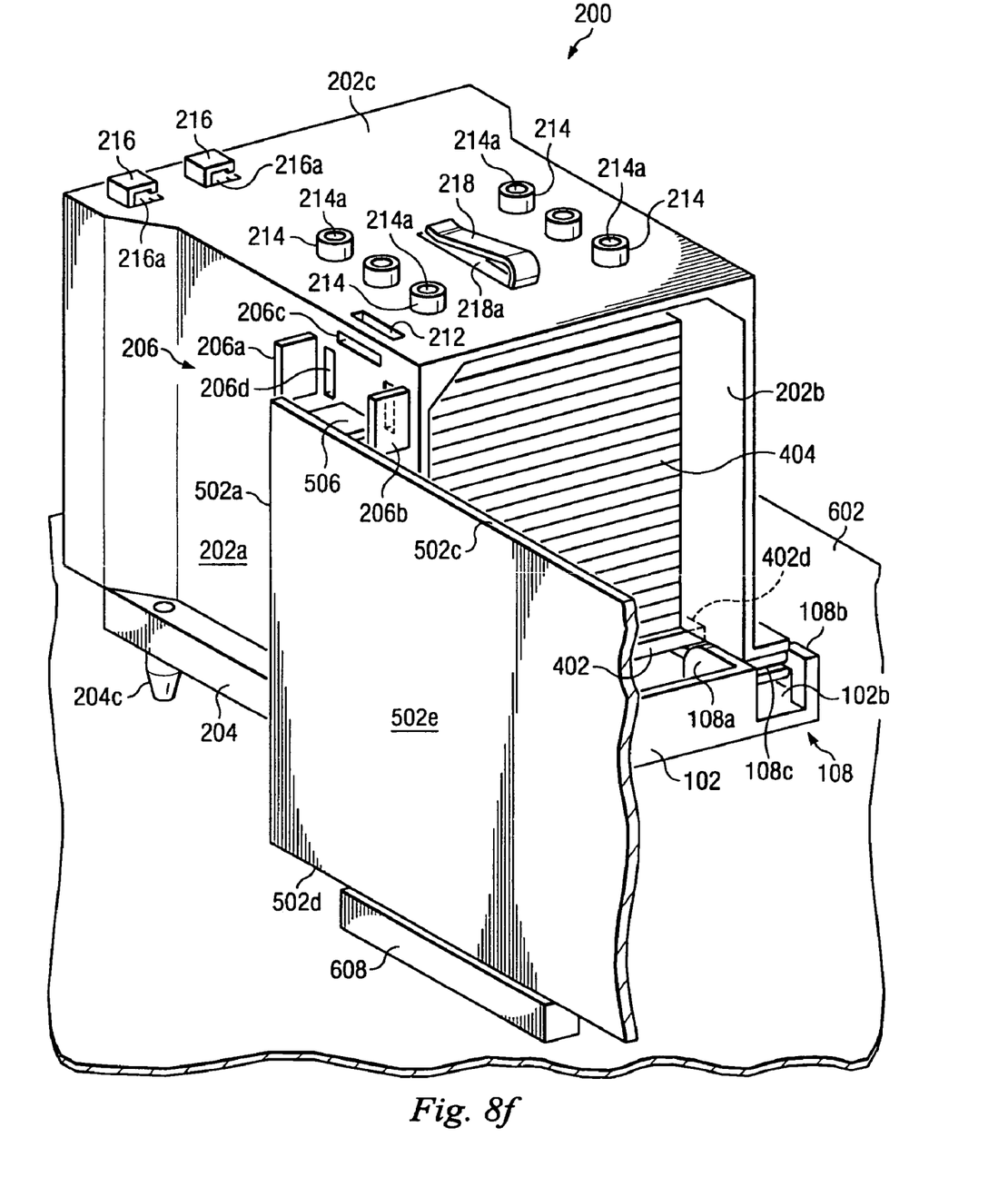
Figure 8G:
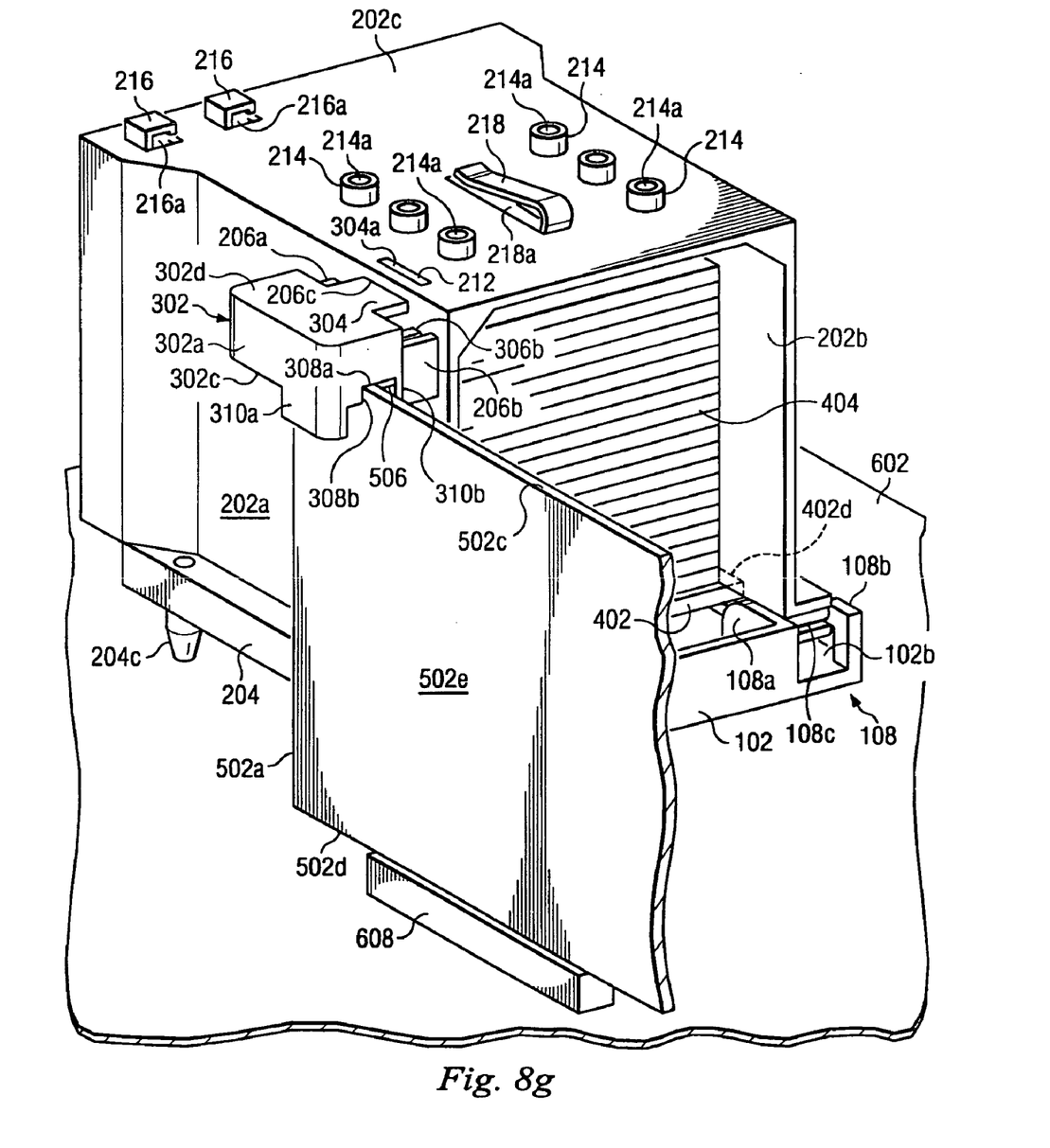

Referring now to FIGS. 4, 6, 8a, 8e, 8f, and 8g, the method 700 then proceeds to step 712 where the card 500 is coupled to the board 600. The card 500 is positioned adjacent the top surface 602 of the board 600 such that the board coupling plug 504 is positioned adjacent the card coupling member 608. The card 500 may then be coupled to the board 600 by matingly engaging the board coupling plug 504 with the card slot 608a on the card coupling member 608, as illustrated in FIG. 8f. The method 700 then proceeds to step 714 where the card retention device 300 is coupled to the heat sink mount 200. The guide end 304a on guide arm 304 is positioned in the guide aperture 206c and moved through the guide aperture 206c such that the guide end 304a enters the guide aperture 212. As the guide end 304a is positioned in the guide aperture 212, the card retention device 300 pivots about the guide end 304a of guide arm 304 and towards the top surface 502c of the card 500. As the card retention device 300 pivots, the securing members 306aa and 306ba on coupling arms 306a and 306b, respectively, enter the coupling apertures 206e and 206d, respectively, and secure the card retention device 300 to the heat sink mount 200. With the card retention device 300 coupled to the heat sink mount 200, the card 500 enters the card retention channel 308, the card retention surfaces 308a and 308b on the card retention device 300 engage the top surface 502c and the side surface 502e, respectively, of the card 500, and the retention arm 310b engages the stabilizing tab 506 in order to retain the card 500 in the card slot 608a of card coupling member 608 on board 600, as illustrated in FIG. 8g. In an embodiment, a half-sized card or three-quarters length card may be retained on the board 600 in substantially the same manner as described above with the provision of coupling the card retention device 300 to the card retention device coupling member 206 which is centrally located on the side wall 202a of heat sink mount 200. In an embodiment, the card may also be supported and retained along its rear surface 502b.

Figure 8H:
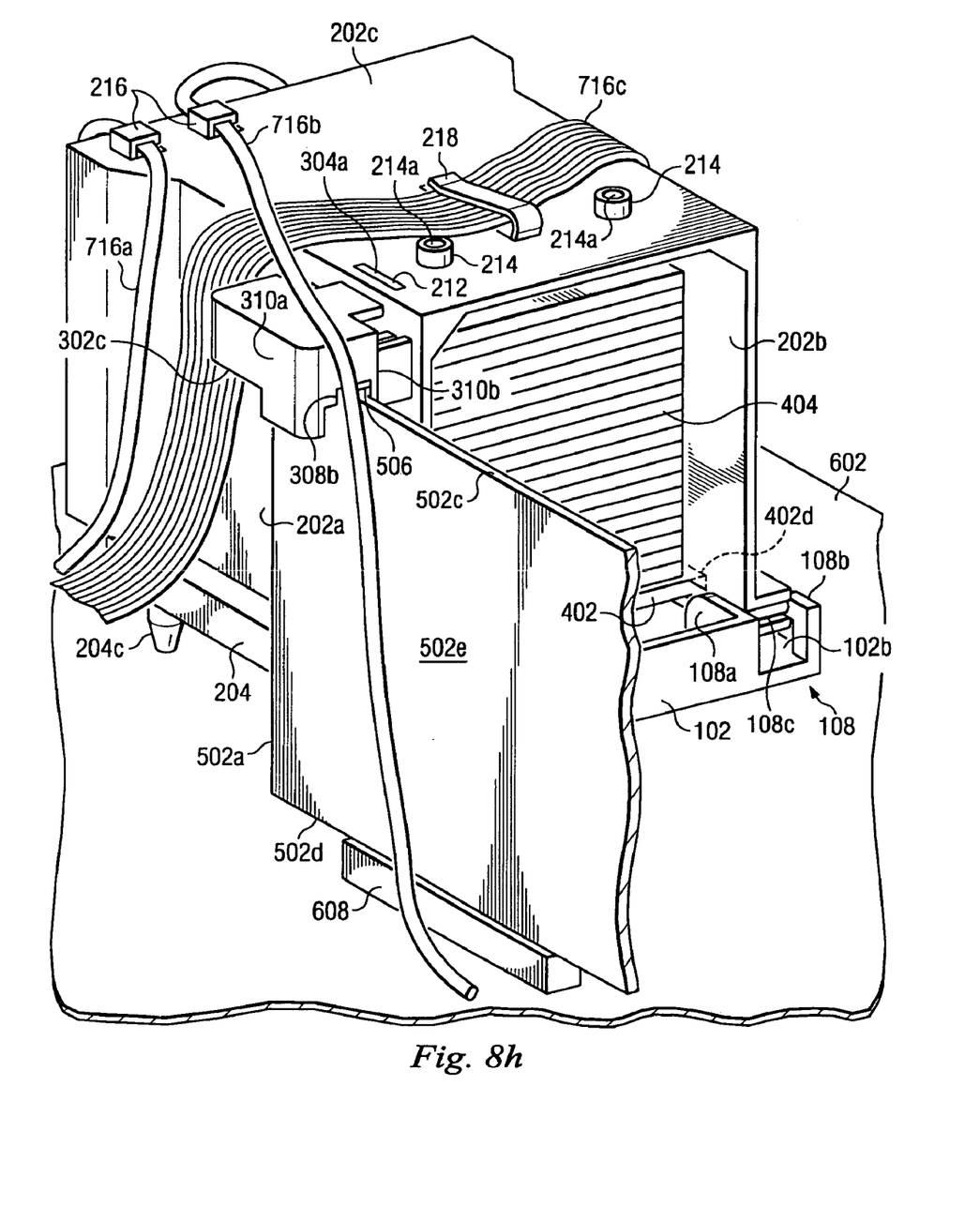
Figure 8I:
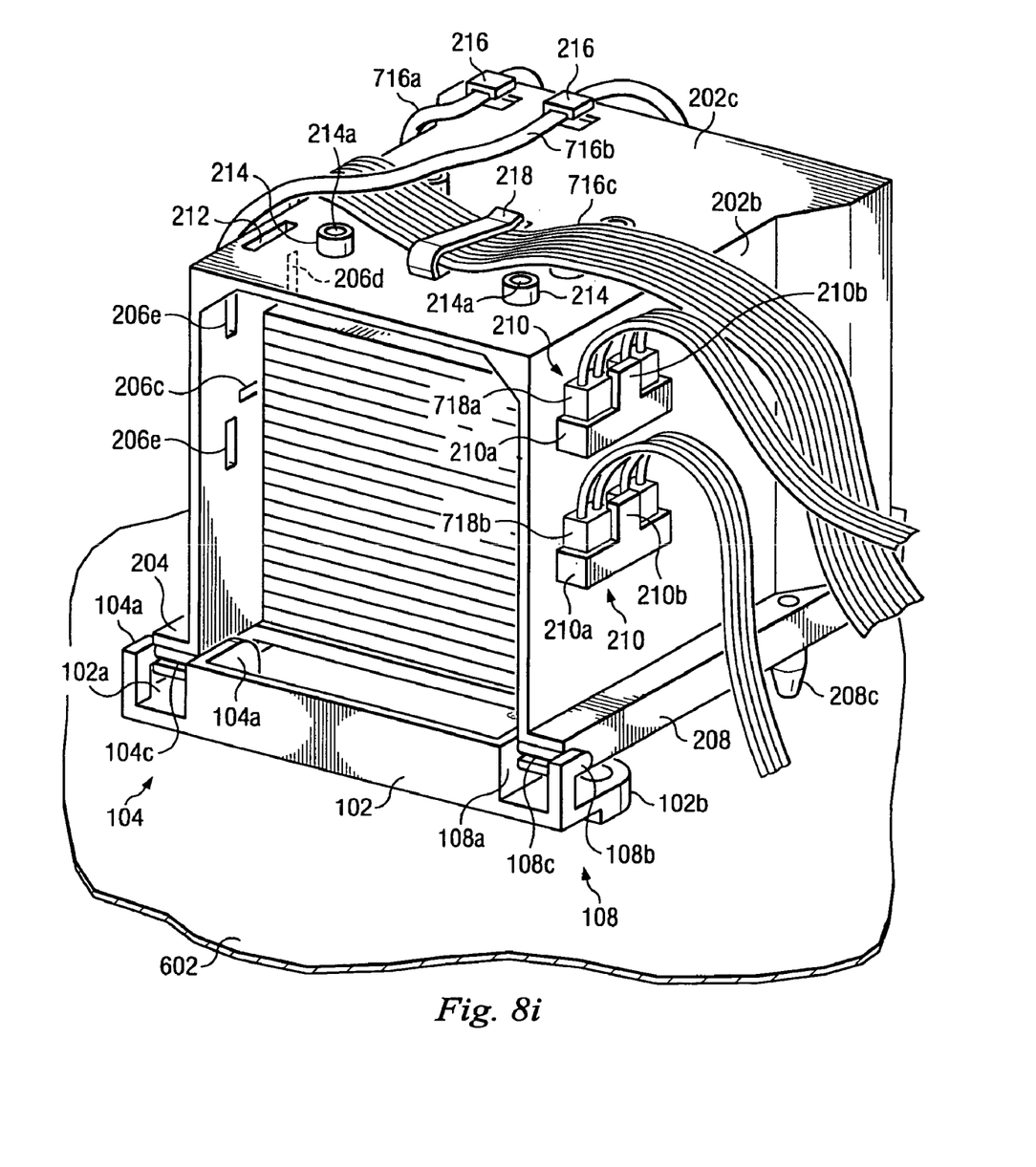

Referring now to FIGS. 3b, 8a, 8g, 8h, and 8i, the method 700 proceeds to step 716 where a plurality of cables are routed on the heat sink mount 200. A pair of round cables 716a and 716b are positioned in the cable routing channels 216a on the small cable routing members 216, and a ribbon cable 716c is positioned in the cable routing channel 218a on large cable routing member 218, as illustrated in FIG. 8h. The method 700 then proceeds to step 718 where a plurality of connectors are stored on the heat sink mount 200. A plurality of connectors 718a and 718b are positioned in the storage slots 210a defined by the storage bases 210a on connector storage members 210, as illustrated in FIG. 8i. With connectors 718a and 718b positioned in storage slots 210aa, the securing lips 210ba on securing arms 210b engage the connectors 718a and 718b to secure the connectors 718a and 718b to the heat sink mount 200. With the connectors 718a and 718b stored in the connector storage members 210, a means is provided to restrict the connectors 718a and 718b from shorting out against metal which may be in the information handling system chassis.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A heat sink retention apparatus comprising:
   a base member; and
   a heat sink mount including a pivotal base coupler and a board mounting member, whereby the heat sink mount is operable to mount to a board by engaging the pivotal base coupler with the base member and engaging the board mounting member with the board.

2. The apparatus of claim 1 wherein the heat sink mount comprises a cable routing member.

3. The apparatus of claim 1 wherein the heat sink mount comprises a connector storage member.

4. The apparatus of claim 1 wherein the heat sink mount comprises a card retention device coupling member.

5. The apparatus of claim 1 further comprising:
   a card retention device which is operable to couple to the heat sink mount.

6. The apparatus of claim 1 further comprising:
   a heat sink mounted in the heat sink mount.

7. The apparatus of claim 1 further comprising:
   a board including a heat producing component mounted to the board, whereby the base member is mounted to the board and the heat sink mount is pivotally coupled to the base member with the board mount member engaging the board; and
   a heat sink mounted in the heat sink mount and engaging the heat producing component.

8. The apparatus of claim 7 further comprising:
   a card mounted to the board; and
   a card retention device coupled to the heat sink mount and engaging the card to retain the card on the board.

9. A heat sink retention apparatus comprising:
   a heat sink mount;
   a cable routing member on the heat sink mount; and
   a connector storage member on the heat sink mount.

10. The apparatus of claim 9 wherein the heat sink mount comprises a card retention device coupling member.

11. The apparatus of claim 9 further comprising:
    a card retention device which is operable to couple to the heat sink mount.

12. The apparatus of claim 9 further comprising:
    a heat sink mounted in the heat sink mount.

13. The apparatus of claim 9 further comprising:
    a board including a heat producing component mounted to the board, whereby the heat sink mount is mounted to the board;
    a heat sink mounted in the heat sink mount and engaging the heat producing component;
    a cable routed in the cable routing member; and
    a connector stored in the connector storage member.

14. The apparatus of claim 13 further comprising:
    a card mounted to the board; and
    a card retention device coupled to the heat sink mount and engaging the card to retain the card on the board.

15. A heat sink retention apparatus comprising:
    a heat sink mount;
    a card retention device which is operable to couple to the heat sink mount;
    a board including a heat producing component mounted to the board, whereby the heat sink mount is mounted to the board;
    a heat sink mounted in the heat sink mount and engaging the heat producing component; and
    a card coupled to the board, whereby the card retention device is coupled to the heat sink mount and engages the card to retain the card on the board.

16. A heat sink retention apparatus comprising:
    a heat sink mount; and
    a card retention device which is operable to couple to the heat sink mount, wherein the heat sink mount comprises a cable routing member.

17. A heat sink retention apparatus comprising:
    a heat sink mount; and
    a card retention device which is operable to couple to the heat sink mount, wherein the heat sink mount comprises a connector storage member.

18. The apparatus of claim 17 wherein the heat sink mount comprises a card retention device coupling member.

19. The apparatus of claim 17 further comprising:
a heat sink mounted in the heat sink mount.

20. A method for heat sink and card retention comprising:
providing a board including a heat producing component mounted to the board;
providing a heat sink mount including a heat sink mounted in the heat sink mount;
mounting the heat sink mount to the board, whereby the mounting engages the heat sink with the heat producing component;
coupling a card to the board; and
coupling a card retention device to the heat sink mount, whereby the coupling a card retention device to the heat sink mount includes engaging the card with the card retention device and retaining the card on the board.

21. The method of claim 20 wherein the mounting the heat sink to the board comprises:
providing a base mounting member on the heat sink mount;
mounting a base member to the board;
pivotally coupling the heat sink mount to the base member; and
engaging the base mounting member with the board.

22. The method of claim 20 further comprising:
providing a cable routing member and a connector storage member on the heat sink mount;
routing a cable in the cable routing member; and
storing a connector in the connector storage member.

23. A heat sink and card retention apparatus comprising:
a base member;
a heat sink mount including a pivotal base coupler and a board mounting member, whereby the heat sink mount is operable to mount to a board by engaging the pivotal base coupler with the base member and engaging the board mounting member with the board;
a cable routing member on the heat sink mount;
a connector storage member on the heat sink mount; and
a card retention device which is operable to couple to the heat sink mount to retain a card on a board.

* * * * *